United States Patent
Gill

(10) Patent No.: US 8,053,072 B2
(45) Date of Patent: Nov. 8, 2011

(54) METHOD OF REDUCING POROSITY IN THERMAL SPRAY COATED AND SINTERED ARTICLES

(75) Inventor: Brian James Gill, Avondale, AZ (US)

(73) Assignee: Praxair Technology, Inc., Danbury, CT (US)

( * ) Notice: Subject to any disclaimer, the term of this patent is extended or adjusted under 35 U.S.C. 154(b) by 52 days.

(21) Appl. No.: 12/331,550

(22) Filed: Dec. 10, 2008

(65) Prior Publication Data

US 2009/0087642 A1   Apr. 2, 2009

Related U.S. Application Data

(62) Division of application No. 11/546,388, filed on Oct. 12, 2006, now Pat. No. 7,799,384.

(51) Int. Cl.
*B32B 3/26* (2006.01)
(52) U.S. Cl. ............... 428/319.1; 428/312.8; 428/307.3; 428/307.7; 428/702; 428/704
(58) Field of Classification Search .................. None
See application file for complete search history.

(56) References Cited

U.S. PATENT DOCUMENTS

| | | | |
|---|---|---|---|
| 3,016,447 A | 1/1962 | Gage, et al. | |
| 3,228,795 A | 1/1966 | Ackermann | |
| 3,442,710 A | 5/1969 | Menard | |
| 3,540,930 A | 11/1970 | Loukomsky | |
| 3,558,359 A | 1/1971 | Jost | |
| 4,519,840 A | 5/1985 | Jackson et al. | |
| 4,626,476 A | 12/1986 | Londry et al. | |
| 5,232,889 A | 8/1993 | Blanchard et al. | |
| 5,364,522 A | 11/1994 | Wang | |
| 5,505,248 A | 4/1996 | Aghajanian et al. | |
| 5,869,144 A | 2/1999 | Stavros | |
| 5,954,893 A | 9/1999 | Baldwin et al. | |
| 6,036,762 A | 3/2000 | Sambasivan | |
| 6,503,290 B1 | 1/2003 | Jarosinski et al. | |
| 6,805,785 B2 | 10/2004 | Nanno et al. | |
| 2001/0003631 A1 | 6/2001 | Villiger et al. | |
| 2004/0238848 A1 | 12/2004 | Arai | |

*Primary Examiner* — Ling Xu
(74) *Attorney, Agent, or Firm* — Nilay S. Dalal; Iurie A. Schwartz

(57) ABSTRACT

This invention relates to an article having a reduced porosity and a method for sealing porosity of at least a portion of an outer porous surface of an article, said method comprising (i) applying a sealant solution on the outer porous surface of said article, (ii) infiltrating at least a portion of the outer porous surface with said sealant solution, and (iii) allowing the infiltrated sealant solution to react, thereby forming an infiltrated solid precipitate, said infiltrated solid precipitate sealing the porosity of at least a portion of the outer porous surface of said article. The method is useful, for example, in the protection of integrated circuit manufacturing equipment, internal chamber components, and electrostatic chuck manufacture.

7 Claims, No Drawings

METHOD OF REDUCING POROSITY IN THERMAL SPRAY COATED AND SINTERED ARTICLES

RELATED APPLICATIONS

This application is a divisional of prior U.S. application Ser. No. 11/546,388, filed Oct. 12, 2006, now U.S. Pat. No. 7,799,384 for "METHOD OF REDUCING POROSITY IN THERMAL SPRAY COATED AND SINTERED ARTICLES", the content of which is incorporated by reference in its entirety.

FIELD OF THE INVENTION

This invention relates to a method for in situ precipitation from infiltrated inorganic chemical salt solutions to form compatible solid compounds within the interconnected pores of thermal spray coated or sintered articles. The method is useful, for example, in the protection of integrated circuit manufacturing equipment, internal chamber components, and electrostatic chuck manufacture.

BACKGROUND OF THE INVENTION

Thermal spray coatings can be used for the protection of equipment and components used in corrosive environments. Such thermally sprayed coatings are derived from the heating, acceleration of materials, originally in solid form as powder or wire, through a thermal spray device in which they are rendered semi-molten and deformable prior to impact on a work piece surface. As such, they contain differing degrees of residual porosity which may range in size from the clearly visible to the sub-micron. Much of the porosity is interconnected and forms networks of surface-to-substrate channels into which corrosive process gases may penetrate. Corrosion of the coating, or of the substrate if penetration is complete, is unacceptable in coated equipment used in integrated circuit manufacture because of the generation of contaminant corrosion products and particles.

U.S. Pat. No. 5,869,144 discloses a process for sealing the outer porous surface of an article with a boron nitride-silicate-containing sealant. Articles, i.e., rolls, intended for use with molten zinc are coated with a protective layer such as tungsten carbide cobalt, alumina, zirconia or molybdenum boride. The sealant is then deposited over the coating to prevent penetration of molten zinc to the substrate of the roll and also to minimize buildup of oxides and/or dross on the surface of the coated roll from the molten zinc.

There is a need in the art for blocking or sealing the interconnected residual micro-porosity in thermal spray coated and sintered articles, including metallic and carbide-based coatings operating at high temperatures, but particularly those of the ceramic oxides, e.g., yttria and alumina, to reduce the level of corrosive attack by process reagents. There also is a need for blocking or sealing the porosity especially in coatings or sintered bodies used in equipment employed in integrated circuit manufacture without using any hydrocarbon or other resin systems, or without introducing any foreign metal cations, mobile or otherwise, or without causing any coloration or reduction in whiteness of the coating.

SUMMARY OF THE INVENTION

This invention relates in part to a method for sealing porosity of at least a portion of an outer porous surface of an article, said method comprising (i) applying a first solution on the outer porous surface of said article, (ii) infiltrating at least a portion of the outer porous surface with said first solution, (iii) applying a second solution on the outer porous surface of said article, (iv) infiltrating at least a portion of the outer porous surface with said second solution, and (v) allowing the infiltrated first solution and the infiltrated second solution to react, thereby forming an infiltrated solid precipitate, said infiltrated solid precipitate sealing the porosity of at least a portion of the outer porous surface of said article.

This invention also relates in part to a method for sealing porosity of at least a portion of an outer porous surface of an article, said method comprising (i) applying a sealant solution on the outer porous surface of said article, (ii) infiltrating at least a portion of the outer porous surface with said sealant solution, and (iii) allowing the infiltrated sealant solution to react, thereby forming an infiltrated solid precipitate, said infiltrated solid precipitate sealing the porosity of at least a portion of the outer porous surface of said article.

This invention further relates in part to articles, e.g., integrated circuit manufacturing equipment, deposition chamber components and electrostatic chucks, having an outer porous surface in which at least a portion of said outer porous surface is sealed with a precipitated sealant solution.

This invention yet further relates in part to articles prepared by the method of this invention.

The method of this invention enables interconnected porosity in thermal spray coated and sintered articles to be sealed with white, microcrystalline deposits which contain no foreign metallic cations and no hydrocarbon or silicone resins and solvents. The method is particularly compatible with high purity oxide ceramic coatings used in the electronics industry because high purity chemicals can be used. The method can enable treated thermal spray coated and sintered articles to exceed by a factor of 4-5 the 4 hour penetration resistance requirement of a typical hydrochloric acid test used by the industry. Additionally, the method of this invention can improve the whiteness of thermally sprayed ceramic oxide coatings and sintered bodies which is important for yttria and alumina coatings.

DETAILED DESCRIPTION OF THE INVENTION

In accordance with this invention, in-situ precipitation from infiltrated inorganic chemical salt solutions is used to form compatible solid compounds within the interconnected pores in articles having a thermally sprayed coating or a sintered article, thereby reducing or eliminating porosity-related problems such as penetration and corrosion by fluids, (liquids or gases) in the articles. The porosity related problems are applicable to a variety of metal, metal alloy and ceramic products, particularly so in coatings and ceramics used in the electronics industry in plasma and chemical vapor deposition chambers and in electrostatic chucks where the presence of mobile contaminant metallic cations must be avoided. Porosity related problems also occur in anodization which contains inherent surface-to-substrate microporosity in the form of vertical channels formed naturally during anodic growth of the oxide surface film.

This invention provides a method for blocking or sealing the inter-connected residual micro-porosity in thermal spray coated and sintered articles, particularly those of the ceramic oxides, yttria and alumina, thereby reducing the level of corrosive attack by process reagents. This has been accomplished by the method of this invention without using any hydrocarbon or other resin systems, without introducing any foreign metal cations, mobile or otherwise, and without causing any coloration or reduction in whiteness of the coating. Special electronics grade brushes with nylon bristles held ideally by molding, rather than by a potentially soluble epoxy resin in a polyethylene or polypropylene handle, should be used to avoid sodium and other contaminants.

As shown in the examples hereinbelow, corrosion tests were conducted on the articles of this invention based on the resistance of a coating to penetration by an aqueous solution of hydrochloric acid. In different forms, hydrochloric acid penetration tests are invariably part of customer qualification requirements for coatings.

As indicated above, this invention relates to a method for sealing porosity of at least a portion of an outer porous surface of an article, said method comprising (i) applying a first solution on the outer porous surface of said article, (ii) infiltrating at least a portion of the outer porous surface with said first solution, (iii) applying a second solution on the outer porous surface of said article, (iv) infiltrating at least a portion of the outer porous surface with said second solution, and (v) allowing the infiltrated first solution and the infiltrated second solution to react, thereby forming an infiltrated solid precipitate, said infiltrated solid precipitate sealing the porosity of at least a portion of the outer porous surface of said article.

In an embodiment, this invention relates to a method for sealing porosity of at least a portion of an outer porous surface of an article, said method comprising (i) applying a sealant solution on the outer porous surface of said article, (ii) infiltrating at least a portion of the outer porous surface with said sealant solution, and (iii) allowing the infiltrated sealant solution to react, thereby forming an infiltrated solid precipitate, said infiltrated solid precipitate sealing the porosity of at least a portion of the outer porous surface of said article.

This invention consists of the application of solutions of compatible inorganic ionic reagents such that they are infiltrated into the residual porosity of coatings or sintered bodies and react chemically in-situ within the coating or sintered body to form a solid precipitate. The formation of these solid precipitates seals porosity from within the body of the coating.

The method of this invention uses inorganic ionic solutions of compatible chemical reagents. For example, the method uses yttrium salts for yttrium coatings, aluminum salts for alumina coatings and can use zirconium salts for zirconia coatings. This invention can employ virtually any inorganic ionic solution with any coating or sintered body and the solutions are interchangeable, e.g., cerium salts with yttria coatings, aluminum salts with zirconia coatings, and the like. The reacting solutions, e.g., a first solution comprising a metal salt solution (e.g., yttrium nitrate) and a second solution comprising a basic solution (e.g., ammonium hydroxide) or a sealant solution comprising a mixture of the metal salt solution and basic solution, are preferably of low viscosity, thereby allowing the solutions to penetrate the micron and sub-micron porosity found in thermally sprayed coatings and sintered ceramic bodies.

The yttrium and zirconium salts work well separately and together to form hydroxy-nitrate precipitated solid compounds, and work better if these reaction products are fired after drying. Since most chamber components for integrated circuit manufacture are made from aluminum, the scope for high temperature heat treatment is limited to about 200° C. For high temperature thermal barrier coatings on nickel alloys for gas turbines or for corrosion resistant coatings on steels for the galvanizing industry, the in-situ precipitates of zirconia and yttria can easily be heat treated to achieve decomposition into oxides. The scope for doping zirconia coatings with other oxides by this method is very wide because of the scope for thermal decomposition allowed by the use of nickel and cobalt super alloy substrates.

In an embodiment, a preferred method of this invention includes a post-application heat treatment of the sealed article at a temperature of greater than 750° C., (rather than a drying treatment at 120° C. dictated by the presence of an aluminum substrate) in order to stabilize, rather than dry, the in-situ precipitate.

In the method of this invention, a sealing treatment agent is applied onto the thermal sprayed coating formed on the surface of the substrate or onto the sintered article in the aforementioned coating formation step. The sealing treatment agents are selected from solutions of inorganic salts of a desired metallic cation, which can form solid reaction products on contact. In an embodiment employing a first and second solution, the solutions are applied sequentially, allowed to come into contact and to react chemically within the pores of the porous article. In an embodiment employing a sealant solution, although some reaction will have started upon the mixing of the metal salt solution with the base solution, the sealant solution should be applied in sufficient time to allow infiltration and precipitation of the solution within the pores of the porous article.

Illustrative metal salts which can be used in the method of this invention include, for example, yttrium, cerium, lanthanum, aluminum or other nitrates, chlorides or sulfates. Nitrates are particularly effective in electronic applications since they avoid contamination by sulfur and chlorine. Illustrative basic reacting solutions include, for example, ammonium hydroxide, sodium hydroxide and potassium hydroxide. For certain electronic applications, basic materials such as sodium hydroxide and potassium hydroxide are highly undesirable because of the high mobility of sodium and potassium cations and process chamber contamination issues.

The concentration of the metal salt starting solution can vary over a wide range, and need only be that minimum amount necessary to react with the base starting material to form the hydroxy-nitrate precipitates. In general, the metal salt starting material concentrations in the range of from about 1 millimole or less to about 10,000 millimoles or greater, should be sufficient for most processes.

The concentration of the base starting solution can vary over a wide range, and need only be that minimum amount necessary to react with the metal salt starting material to form the hydroxy-nitrate precipitates. In general, the base starting material concentrations in the range of from about 1 millimole or less to about 10,000 millimoles or greater, should be sufficient for most processes.

Typically, the aqueous sealant solutions can contain from about 20 to about 300 grams per liter of yttrium nitrate, and from about 20 to about 200 milliliters per liter of ammonium hydroxide (0.880 specific gravity). Preferably, the aqueous sealant solution can contain from about 80 to about 140 grams per liter of yttrium nitrate, and from about 25 to about 40 milliliters per liter of ammonium hydroxide. It is also within the scope of this invention to use solutions of two different metallic salts, such as a mixture of yttrium and zirconium or magnesium.

The reacting sealant solution, e.g., yttrium nitrate and ammonium hydroxide, after chemical reaction forms hydroxy-nitrate precipitates, which can provide excellent resistance to penetration and corrosion by fluids, e.g., liquids and gases, especially gas corrosion. The reactive sealant solutions are preferably applied to the coated or sintered article which is used in an environment of corrosive gases. Corrosive gases and liquids attack coated articles, sintered articles and the like and easily penetrate into small holes or gaps in the micrometer range because of their porosity.

Illustrative hydroxy-nitrate precipitates used in the method of this invention include, for example, yttrium hydroxy nitrate, cerium hydroxy nitrate, lanthanum hydroxy nitrate, and the like.

Reaction conditions for the reaction of the base material, e.g., ammonium hydroxide, with the metal salt material, e.g., yttrium nitrate, such as temperature, infiltration time and contact time, may also vary greatly and any suitable combination of such conditions may be employed herein. Normally the reaction is carried out under ambient temperature and the infiltration and contact time may vary from a matter of seconds or minutes to a few hours or greater. The reactants can be applied to the coated or sintered article separately in any order or combined in any order. For sealant solutions, although some reaction will have started upon the mixing of the metal salt solution with the base solution, the mixing time employed should be sufficiently short to allow the sealant solution to be applied and infiltrated into the coated or sintered article.

For electronics applications, electronics grade chemical reagents are essential to avoid unacceptable levels of mobile metallic cations in the precipitate. In an embodiment of this invention, the application of ammonium hydroxide followed by the appropriate yttrium or aluminum salts solution gives more consistent hydrochloric acid test performance that the other way round.

According to this invention, reactive sealant solutions are provided for thermally sprayed coated articles or sintered articles intended to come into contact with a corrosive environment. The precipitated sealant solution reduces or eliminates porosity-related problems such as penetration and corrosion by fluids, particularly in coatings and ceramics used in the electronics industry in plasma and chemical vapor deposition chambers and in electrostatic chucks where the presence of mobile contaminant metallic cations must be avoided. The sealant solution is easy to apply and cost effective to produce.

The sealing material exhibits desired resistance to corrosive liquids and gases, thus making it ideally suitable for coating structural materials, such as components used in the plasma chambers employed in the manufacture of integrated circuit components, internal deposition chamber components, electrostatic chucks and the like, that are intended to be used in or in contact with corrosive environments.

An illustrative sealing method of this invention is as follows:
 (a) preparing a first reactive solution;
 (b) applying the first reactive solution on the outer porous surface of the article to be sealed;
 (c) allowing the first reactive solution to infiltrate the outer porous surface of the article;
 (d) applying a second reactive solution on the outer porous surface of the article to be sealed;
 (e) allowing the second reactive solution to infiltrate the outer porous surface of the article;
 (f) allowing the first and second reactive infiltrated solutions to react, thereby forming an infiltrated solid precipitate, said infiltrated solid precipitate sealing the porosity of at least a portion of the outer porous surface of said article; and
 (g) heating the coated article in an appropriate temperature range to substantially remove the water from the article and, if the temperature is high enough, convert the infiltrated solid precipitate to an oxide.

Accordingly, this invention utilizes a sealant having an excellent resistance to corrosive fluids, especially to corrosive gases, and the sealant minimizes or eliminates contamination of the coated or sintered article. The sealant comprises an aqueous solution which can be applied to the surface of an article by painting, spraying, such as thermal spraying, or using any other conventional technique.

After applying the aqueous solutions to the article, it should be allowed to infiltrate the porous surface of the article and then dried to remove substantially all of the water. Preferably, the water in the coating should be reduced to 10% or less of the water used in the aqueous solution and preferably reduced to 5% or less of the water used in the aqueous solution. To insure removal of the water, the coated article could be heated above 100° C. for a time period to reduce the water in the coating to 5% or less. Generally, a time period of about 4 to about 8 hours would be sufficient, with a time period of about 16 to about 24 hours being preferred. It is preferable to heat the coated article above 100° C. since chemically combined water is removed better at higher temperatures.

The sealant will eliminate or reduce porosity related problems such as penetration and corrosion of the porous surface by liquids and gases. The amount of yttrium salts should be sufficient to provide a compatible solid compound infiltrated into the porous surface, thus sealing the article from penetration and corrosion by fluids.

According to this invention, articles intended for use in corrosive environments are first thermal spray coated with a protective coating layer or a sintered article is produced. The sealant can then be deposited over the coating or sintered article to prevent penetration of corrosive liquids and gases to the substrate of the article. For sealing porosity in a zirconia outer porous surface of an article by precipitation of a zirconium compound, a solution of zirconium nitrate and a solution of ammonium hydroxide could be infiltrated and precipitated in the porosity of the outer porous surface. The sealed thermal sprayed coated article or sintered article formed by the method of this invention may have desired corrosion resistance, heat resistance, thermal shock resistance, oxidation resistance, and wear resistance.

The method of this invention offers significant advantages, in particular economic advantages. It uses high purity reagents which are commercially available from laboratory suppliers for analytical and electronics industry purposes. It is an ambient laboratory or clean-room method requiring no vacuum chambers or capital equipment other than standard chemical laboratory equipment. The chemical regents are inorganic, inexpensive and with minimal handling and usage hazards. They have low level corrosive and oxidizer classifications. With respect to the reagents used in the method, there are no exceptional disposal procedures involved.

In cases where only certain parts of a component are coated, the method of this invention may work best by applicator painting. High grade cleaned and boiled electronics grade brushes should be used to avoid contamination. Tank immersion would lead to cross contamination.

There is no real size limitation on articles which may be treated by the method of this invention, provided that the articles can be dried in an air oven as described or at temperatures of up to 100° C. if necessary. It would be desirable to heat treat the internal precipitate to ensure decomposition, but this is not practicable with an aluminum substrate. A rastering laser may work with an aluminum substrate. Materials other than aluminum will almost certainly have higher temperature capability. It is also important not to leave residual pools or puddles between treatments because once they begin to dry, they leave water marks which can be difficult to remove.

The coated articles used in the method of this invention can be prepared by flowing powder through a thermal spraying device that heats and accelerates the powder onto a base (substrate). Upon impact, the heated particle deforms resulting in a thermal sprayed lamella or splat. Overlapping splats make up the coating structure. A plasma spray process useful in this invention is disclosed in U.S. Pat. No. 3,016,447, the disclosure of which is incorporated herein by reference. A detonation process useful in this invention is disclosed in U.S. Pat. Nos. 4,519,840 and 4,626,476, the disclosures of which are incorporated herein by reference, which include coatings containing tungsten carbide cobalt chromium compositions. U.S. Pat. No. 6,503,290, the disclosure of which is incorporated herein by reference, discloses a high velocity oxygen fuel process useful in this invention to coat compositions containing W, C, Co, and Cr. Cold spraying methods known in the art may also be useful in this invention. Typically, such cold spraying methods use liquid helium gas which is expanded through a nozzle and allowed to entrain powder particles. The entrained powder particles are then accelerated to impact upon a suitably positioned workpiece.

In coating the articles of this invention, the thermal spraying powder is thermally sprayed onto the surface of the article, and as a result, a thermal sprayed coating is formed on the surface of the article. High-velocity-oxygen-fuel or detonation gun spraying are illustrative methods of thermally spraying the thermal spraying powder. Other coating formation processes include plasma spraying, plasma transfer arc (PTA), or flame spraying. For electronics applications, plasma spraying is preferred for yttria and alumina coatings because there is no hydrocarbon combustion and therefore no source of contamination. Plasma spraying uses clean electrical energy. Preferred coatings for thermally spray coated articles of this invention include, for example, yttrium oxide, zirconium oxide, magnesium oxide, cerium oxide, aluminum oxide, or oxides of Groups 2A to 8B inclusive of the Periodic Table and the Lanthanide elements.

The method of this invention can be used with pressed and sintered alumina and yttria and ceramic alloys and other coatings such as alumina-titania, and multi-layered sprayed ceramic coatings. The method may be suitable for forming metal-ceramic composites where ceramic loadings are low, and it may even be useful in toughening ceramics by providing energy absorbing microcrystalline crack-stoppers.

This method appears readily adaptable to the precipitation of inorganic compounds of other materials of interest in ceramic coatings for electronics applications such as ceria, magnesia and hafnia in ceria, magnesia or hafnia thermally sprayed coatings or the creation of, for example, ceria sealing precipitates in an yttria coating or possibly titania in an yttria or hafnia coating. Many combinations are included within the scope of this invention if the appropriate inorganic reagents are used.

The in-situ precipitation of desired compounds within the pores of a porous body can also be applied to bind solutions of nanoparticle or slurries which are infiltrated. As an example, a fluid suspension of nanoparticles of yttrium oxide is infiltrated into the porosity of a thermally sprayed oxide ceramic coating and the suspension fluid is allowed to dry by evaporation. Two reacting solutions, e.g., yttrium nitrate and ammonium hydroxide, can be infiltrated sequentially and allowed to react chemically. The resultant precipitated material binds in the infiltrated nanoparticles thereby blocking or closing the porosity and preventing the nanoparticle from becoming dislodged.

Slurries of suspended particles, e.g., alumina, may also be infiltrated into a porous body and bonded in place by use of aluminum based reacting solutions or by solutions or another material of choice, e.g., yttrium nitrate, cerium nitrate or zirconium nitrate.

The inherent pore channels in anodization may be treated with solutions of metallic salts as described herein to enhance the corrosion resistance of anodically grown alumina film.

In another embodiment, in view of the very complex geometries of parts which require coating with a line of sight thermal spray process, the method of this invention may be useful for making a "paint-on" coating or for supplementing the thermal spray coating in some way so as to afford protection to difficult areas or areas where, for example, anodizing ends and thermal spray coating begins.

It should be apparent to those skilled in the art that this invention may be embodied in many other specific forms without departing from the spirit of scope of the invention.

The following examples are provided to further describe the invention. The examples are intended to be illustrative in nature and are not to be construed as limiting the scope of the invention.

EXAMPLES

Aqueous solutions of high purity yttrium nitrate and ammonium hydroxide were prepared in several different concentrations and applied in different orders in various examples to thermally sprayed yttrium oxide coated samples. Ammonium hydroxide reactant was applied first and allowed to soak into the coating without leaving puddles on the surface followed by the yttrium nitrate solution, applied similarly. Residual puddles or pools left water marks which could not be removed. A reaction time of 1 hour in air at room temperature was allowed after which the test pieces were air-oven dried overnight (12 or more hours).

The samples were whiter in color after treatment, attributed to improved reflectivity due to porosity closure and no effects of the treatment were visible on the sample surfaces. The samples were set up for 5 weight percent aqueous hydrochloric acid penetration test and testing commenced. The hydrochloric acid penetration test is described below.

Previous tests on untreated thermally sprayed coatings had given times to penetration of 5 to 25 minutes and a sample of anodized aluminum had lasted for 3.5 hours. Samples treated with the yttrium salts lasted 20-24 hours which compared favorably with the normal targets for this type of test of 4-8 hours. An unexpected result was that the yttria coating itself (0.006 inches) was consumed after 24 hours with the early stages of aluminum substrate grain boundary attack just visible in metallurgical cross-section at 200×.

As used in the examples, a hydrochloric acid penetration test was conducted to assess and rank the quality of thermally sprayed ceramic coatings, particularly yttria, in terms of the time to penetration by a contacting aqueous solution of hydrochloric acid. Time to penetration was taken as the elapsed time between introduction of the acid and penetration of the coating to an aluminum substrate such that substrate corrosion by the acid led to the generation of a stream of at least 2 bubbles of hydrogen gas per second. This point was determined visually. Coatings were ranked in terms of time to penetration.

The acid used in the hydrochloric acid penetration test was a 5 weight percent aqueous solution of concentrated laboratory hydrochloric acid of specific gravity 1.19 grams per milliliter, which represents a fully saturated solution of hydrogen chloride gas in water at ambient temperature and pressure, i.e., fully concentrated hydrochloric acid.

To make a litre of a 5 weight percent aqueous solution of concentrated hydrochloric acid as used in the hydrochloric acid penetration tests, 42.3 milliliters of concentrated Analytical Grade hydrochloric acid of specific gravity 1.19 grams per milliliter acid was added to 957.7 milliliters of deionized water of resistivity greater than 3 megOhm.

The hydrochloric acid penetration test was carried out under ambient lab conditions 20-30° C. Samples were handled using latex gloves and wiped with approved clean-room wipes. Washing was carried out with deionized water and with approved isopropyl alcohol. Glass cylinders and any other equipment and materials which may come into contact with the coating or reagents used in the test were prepared by washing with deionized water, wiping with clean-room wipes and drying with isopropyl alcohol before use.

The procedure for carrying out the hydrochloric acid penetration test is as follows:

Take a 4 inch×4 inch×0.13 inch thermally spray coated test panel coupon and attach to its coated surface at least one clear acid-resistant glass cylinder using an acid-resistant sealant glue. To do this run a bead of sealant around the base of the cylinder at its contact point with the coated sample taking care not to allow sealant to run under the cylinder walls and on to the coated surface to be tested. With careful positioning it may be possible to attach 4 or even 5. Each cylinder should have a minimum inner diameter of 0.5 inch and a minimum height of 3 inches.

Allow the acid-resistant sealant glue to cure.

Prepare 5 weight percent aqueous solution of hydrochloric acid as above, (42.3 milliliters of concentrated analytical grade hydrochloric acid added to 957.7 milliliters of deionized water greater than 3 megOhm).

Position a black matte plane surface behind the array of cylinders and arrange a light source at right angles to the direction of viewing. This shows the evolution of fine bubbles more clearly than direct observation under normal lab. lighting conditions.

Fill the cylinders with the 5 weight percent aqueous hydrochloric acid solution to a minimum depth of 2 inches.

Observe the coating surface and the solution in the cylinders and record the times taken for each sample to generate a stream of hydrogen gas bubbles with an evolution of 2 bubbles per second.

Acceptance criteria vary but a typical electronics industry specification requires that a coupon not show an evolution of 2 hydrogen gas bubbles per second for at least 4 hours, i.e., the time to penetration of the acid should be at least 4 hours.

Under the above test conditions, panels thermally sprayed with yttria coatings of 0.008 inches thickness showed times to penetration in the range of 1 to 2.5 hours. After treatment with the sealant solution described herein, times to penetration of coatings of the same thickness were increased to between 12 and 16 hours. In several cases, penetration was delayed until total consumption of the coating in contact with the acid had occurred which gave penetration times of more than 20 hours. This was confirmed by examination of a metallurgical cross-section which showed early stages of inter-granular corrosion penetration.

Samples were tested for low particle generation, and helium pycnometry showed reductions in sub-micron porosity from 17 percent to 5 percent.

Yttrium nitrate, analytical grade, was made up into a 0.3 molar, (80 grams/liter) aqueous solution in 8 meg ohm deionized water and a 10 milliliters/litre solution of ammonium hydroxide was made up. The former is designated "Solution A" and the latter, "Solution B". Observations of precipitation on a watch glass showed that precipitation started after about 2 minutes which gave enough time for the solutions to soak into the yttria ceramic coating.

In one experiment, Solution A was applied to the yttria coating on a 4 inch×4 inch aluminum sheet and after allowing 2 minutes of penetration time and blotting off any excess surface solution, Solution B was applied. After 20 minutes reaction time, the sample was air oven dried at 50° C. for 12 hours. This sample resisted penetration in the hydrochloric acid test for more than 8 hours.

In another test, the application of solutions was reversed and Solution B was applied to a similar sample, allowed to soak in for 2 minutes, blotted off and then Solution A was applied. Watch glass tests showed precipitation to be denser than before and so this is the preferred order. The sample coated with solutions in the order Solution B then Solution A resisted penetration in the hydrochloric acid test for 20 hours. An unexpected result, obtained after metallurgical examination of the sample in cross section, was that, after this time, the full thickness of yttria coating, 0.008 inches, 200 micrometers, was consumed down to the aluminum substrate.

Further experiments to increase the air oven drying temperature were carried out but only to about 105° C. because of concerns that the coating might separate from the aluminum substrate due to thermal expansion mismatch.

X-Ray diffraction analysis was run on samples prepared by the above methods because there was concern about the undesirable presence of mobile metallic cations. The only lines observed on the patterns were due to yttrium oxide, yttrium hydroxide and yttrium nitrate hydrate.

For a zirconia coating desired to be sealed on a high temperature substrate material such as a steel, nickel or cobalt based alloy, with an in-situ precipitate of zirconium oxide or yttrium oxide, the temperature capability of the substrate allows the precipitate to be heat treated above 800° C. The product would be expected to be a composite of yttrium oxide grains bonded by zirconia.

A further experiment showed that the addition of 50 grams per liter of aluminum nitrate to reacting solutions of yttrium nitrate and ammonium hydroxide after firing at high temperature, would be expected to give yttrium oxide grains bonded by alumina.

The low melting point of aluminum alloys precludes the benefits of these reactions because of limitations on heat treatment temperature.

The invention claimed is:

1. An article having an outer porous surface in which at least a portion of said outer porous surface is sealed with a sealant comprising the reaction product of a metal salt and a base to form an infiltrated solid precipitate having a porosity of not greater than about 5.0%, wherein the infiltrated solid precipitate comprises yttrium hydroxy nitrate, cerium hydroxy nitrate or lanthanum hydroxy nitrate.

2. The article of claim 1 wherein the metal salt is selected from yttrium nitrate, cerium nitrate or lanthanum nitrate and the base is selected from ammonium hydroxide, potassium hydroxide or sodium hydroxide.

3. The article of claim 1, comprising a sintered article or a metallic article with a thermally sprayed coating that is coated onto the outer porous surface of the article.

4. The article of claim 1 comprising a chamber or a component of said chamber used in the production of an integrated circuit component.

5. The article of claim 1 which comprises a sintered article or a thermally sprayed coating that is coated on the outer porous surface of the article.

6. The article of claim 5, wherein the thermally spray coated article is selected from the group consisting of yttrium oxide, zirconium oxide, magnesium oxide, cerium oxide, aluminum oxide, and oxides of Group 2A to 8B inclusive of the Periodic Table and the Lanthanide elements.

7. The article of claim 1 further comprising a thermally sprayed coating of nanoparticles or slurries bonded to the sealant, the sealant sealing the porosity of at least a portion of the outer porous surface of said article.

* * * * *